United States Patent
Curkste

(10) Patent No.: US 10,778,252 B2
(45) Date of Patent: Sep. 15, 2020

(54) RETRANSMISSION SCHEME FOR LOW-DENSITY PARITY CHECK CODING

(71) Applicant: Nokia Technologies Oy, Espoo (FI)

(72) Inventor: Edgars Curkste, Oulu (FI)

(73) Assignee: Nokia Technologies Oy, Espoo (FI)

( * ) Notice: Subject to any disclaimer, the term of this patent is extended or adjusted under 35 U.S.C. 154(b) by 22 days.

(21) Appl. No.: 16/316,827

(22) PCT Filed: Jul. 13, 2016

(86) PCT No.: PCT/FI2016/050516
§ 371 (c)(1),
(2) Date: Jan. 10, 2019

(87) PCT Pub. No.: WO2018/011455
PCT Pub. Date: Jan. 18, 2018

(65) Prior Publication Data
US 2019/0312596 A1 Oct. 10, 2019

(51) Int. Cl.
*H03M 13/11* (2006.01)
*H03M 13/00* (2006.01)
(Continued)

(52) U.S. Cl.
CPC .... *H03M 13/1168* (2013.01); *H03M 13/1185* (2013.01); *H03M 13/6306* (2013.01);
(Continued)

(58) Field of Classification Search
CPC ......... H03M 13/1168; H03M 13/1185; H03M 13/6306; H04L 1/0057; H04L 1/1819; H04L 1/1845
See application file for complete search history.

(56) References Cited

U.S. PATENT DOCUMENTS 9,577,675 B1 * 2/2017 Varnica ............... H03M 13/116
10,601,545 B2 * 3/2020 Callard ................ H04L 1/1854
(Continued)

FOREIGN PATENT DOCUMENTS

| | | |
|---|---|---|
| EP | 2023491 A1 | 2/2009 |
| WO | 2008111824 A2 | 9/2008 |
| WO | 2015058005 A2 | 4/2015 |

OTHER PUBLICATIONS

Chen, L., et al., "A Novel Scheme for Type-II Hybrid ARQ Protocols using LDPC Codes", 2007 IEEE Wireless Communications and Networking Conference, IEEE, Conference Location: Kowloon, China, Date of Conference: Mar. 11-15, 2007, pp. 682-686. (Year: 2007).*
(Continued)

*Primary Examiner* — Kyle Vallecillo
(74) *Attorney, Agent, or Firm* — Harrington & Smith

(57) ABSTRACT

A solution is disclosed for using low-density parity check codes in connection with a retransmission scheme. A first apparatus encodes a data bit set by using a first parity check matrix in a low-density parity check encoder. The first apparatus transmits the encoded data bit set and some parity bits of the set to a second apparatus in a message, and determines that the second apparatus was not capable of decoding the data bit set. The first apparatus modifies the first parity check matrix by using an overlapping matrix where overlapping elements of the first parity check matrix and the overlapping matrix are combined into a second parity check matrix. The first apparatus encodes the data bit set by using the second parity check matrix to provide a second parity bit set, and transmits at least some parity bits of the second parity bit set to the second apparatus.

20 Claims, 7 Drawing Sheets

(51) Int. Cl.
H04L 1/00 (2006.01)
H04L 1/18 (2006.01)

(52) U.S. Cl.
CPC .......... *H04L 1/0057* (2013.01); *H04L 1/1819* (2013.01); *H04L 1/1845* (2013.01)

(56) References Cited

U.S. PATENT DOCUMENTS

| | | | | |
|---|---|---|---|---|
| 2007/0011565 A1* | 1/2007 | Kim | ................... | H03M 13/116 |
| | | | | 714/758 |
| 2008/0077843 A1* | 3/2008 | Cho | ................... | H03M 13/1114 |
| | | | | 714/801 |
| 2008/0126916 A1* | 5/2008 | Chung | ................. | H03M 13/116 |
| | | | | 714/801 |
| 2012/0054585 A1* | 3/2012 | Jiang | ................. | H03M 13/1111 |
| | | | | 714/777 |
| 2012/0185745 A1 | 7/2012 | Shen et al. | | |
| 2015/0358113 A1* | 12/2015 | Callard | ................. | H04W 28/04 |
| | | | | 714/776 |
| 2015/0381210 A1 | 12/2015 | Doi et al. | | |

OTHER PUBLICATIONS

Dec. 19, 2016, International Search Report of Application No. PCT/FI2016/050516.

\* cited by examiner

US 10,778,252 B2

RETRANSMISSION SCHEME FOR LOW-DENSITY PARITY CHECK CODING

RELATED APPLICATION

This is a U.S. national stage of PCT Application No. PCT/FI2016/050516 filed on Jul. 13, 2016.

FIELD

The invention relates to a solution for carrying out retransmissions in a wireless system employing low-density parity check channel coding.

BACKGROUND

Low-Density Parity Check (LDPC) codes have been used in wireless systems. LDPC codes as such are well known in coding theory and known to approach the Shannon channel capacity limit when utilized properly in data transmission. Irregular LDPC codes are known from the fact that input bits may be encoded with different degrees of coding strength, i.e. each input bit may be protected by a different number of parity check equations. Regular LDPC codes employ the same number of parity check equations for each systematic bit.

An LDPC code can be represented by a bipartite graph, which consists of variable nodes, check nodes and a certain number of edges between these two types of node. Each variable node represents a bit of the codeword and each check nodes represents a parity check of the code. An edge exist between a variable node and a check node only if this bit is checked by this edge-connected parity check equation. The degree of a node is the number of edges connected to this node. An irregular LDPC code has a bipartite graph in which the bit nodes (check nodes) have different degrees. A higher variable node degree means that a bit is protected by more parity check equations, which implies to a lower bit error probability. In this manner, a parity check matrix may be constructed. The parity check matrix defines how parity check bits should be calculated. That is, each parity check bit is calculated from given one or more systematic data bits and parity bits.

Quasi-cyclic LDPC (QC-LDPC) codes have been designed to provide efficient implementations. In a quasi-cyclic implementation, the parity check matrix is constructed by a plurality of sub-matrices, wherein at least some of the sub-matrices are circulant permutation matrices. Some of the other sub-matrices may have another constructions, e.g. a zero matrix construction.

A publication by Beomkyu Shin et al: "Quasi-cyclic LDPC Codes Using Overlapping Matrices and Their Layered Decoders", International Journal of Electronics and Communications, VOL. 68(5), 2014 discloses a method for using QC-LDPC codes and a decoder structure for QC-LDPC codes when the system employs multiple parity check matrices.

BRIEF DESCRIPTION OF THE INVENTION

The invention is defined by the subject-matter of the independent claims. Embodiments are defined in the dependent claims.

LIST OF DRAWINGS

In the following, the invention will be described in greater detail with reference to the embodiments and the accompanying drawings, in which FIG. 1 illustrates some wireless communication scenarios to which embodiments of the invention may be applied;

DESCRIPTION OF EMBODIMENTS

Figure 1:
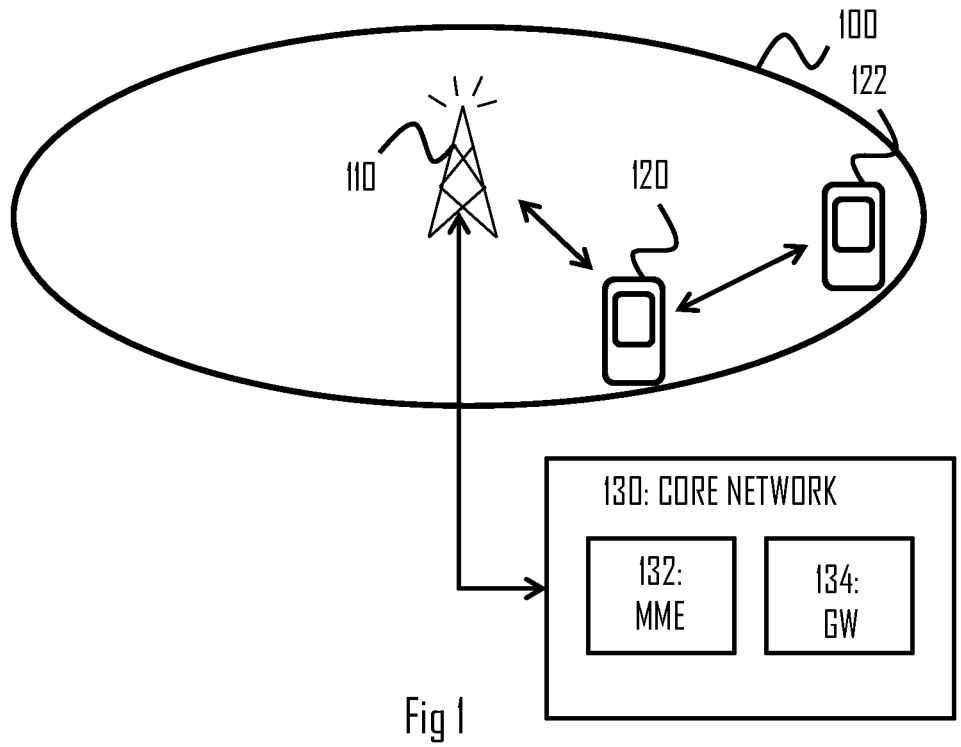

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Embodiments described may be implemented in a radio system, such as in at least one of the following: Universal Mobile Telecommunication System (UMTS, 3G) based on basic wideband-code division multiple access (W-CDMA), high-speed packet access (HSPA), Long Term Evolution (LTE), LTE-Advanced, a system based on IEEE 802.11 specifications, a system based on IEEE 802.15 specifications, and/or a fifth generation (5G) mobile or cellular communication system.

The embodiments are not, however, restricted to the system given as an example but a person skilled in the art may apply the solution to other communication systems provided with necessary properties. One example of a suitable communications system is the 5G system, as listed above. 5G has been envisaged to use multiple-input-multiple-output (MIMO) multi-antenna transmission techniques, more base stations or nodes than the current network deployments of LTE, by using a so-called small cell concept including macro sites operating in co-operation with smaller local area access nodes and perhaps also employing a variety of radio technologies for better coverage and enhanced data rates. 5G will likely be comprised of more than one radio access technology (RAT), each optimized for certain use cases and/or spectrum. 5G system may also incorporate both cellular (3GPP) and non-cellular (e.g. IEEE) technologies. 5G mobile communications will have a wider range of use cases and related applications including video streaming, augmented reality, different ways of data sharing and various forms of machine type applications, including vehicular safety, different sensors and real-time control. 5G is expected to have multiple radio interfaces, including apart from earlier deployed frequencies below 6 GHz, also higher, that is cmWave and mmWave frequencies, and also being integratable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as inter-RI operability between cmWave and mmWave). One of the concepts considered to be used in 5G networks is network slicing in which multiple independent and dedicated virtual sub-networks (network instances) may be created within the same infrastructure to run services that have different requirements on latency, reliability, throughput and mobility.

It should be appreciated that future networks will most probably utilize network functions virtualization (NFV) which is a network architecture concept that proposes virtualizing network node functions into "building blocks" or entities that may be operationally connected or linked together to provide services. A virtualized network function (VNF) may comprise one or more virtual machines running computer program codes using standard or general type servers instead of customized hardware. Cloud computing or cloud data storage may also be utilized. In radio communications this may mean node operations to be carried out, at least partly, in a server, host or node operationally coupled to a remote radio head. It is also possible that node operations will be distributed among a plurality of servers, nodes or hosts. It should also be understood that the distribution of labour between core network operations and base station operations may differ from that of the LTE or even be non-existent. Some other technology advancements probably to be used are Software-Defined Networking (SDN), Big Data, and all-IP, which may change the way networks are being constructed and managed.

FIG. 1 illustrates an example of a communication system to which some embodiments of the invention may be applied. The system may comprise one or more access nodes 110 providing and managing respective cells 100. The cell 100 may be, e.g., a macro cell, a micro cell, femto, or a pico cell, for example. From another point of view, the cell may define a coverage area or a service area of the access node. The access node 110 may be an evolved Node B (eNB) as in the LTE and LTE-A, an access point of an IEEE 802.11-based network (Wi-Fi or wireless local area network, WLAN), or any other apparatus capable of controlling radio communication and managing radio resources within a cell. The access node may provide radio connection to a wireless terminal device need for any intermediate device. In other embodiments, there may be relaying node(s) between the access node and the wireless terminal device. For 5G solutions, the implementation may be similar to LTE-A, as described above. The access node may be called a base station or a network node. The system may be a wireless communication system composed of a radio access network of access nodes, each controlling a respective cell or cells. The access nodes may provide terminal devices (UEs) 120 with wireless access to other networks such as the Internet. In some scenarios, one or more local area access nodes may be arranged within a control area of a macro cell access node. The local area access node may provide wireless access within a sub-cell that may be comprised within a macro cell. Examples of the sub-cell may include a micro, pico and/or femto cell. Typically, the sub-cell provides a hot spot within the macro cell. The operation of the local area access node may be controlled by an access node under whose control area the sub-cell is provided. In some scenarios, a plurality of local area access nodes may be controlled by a single macro cell access node.

In the case of multiple access nodes in the communication network, the access nodes may be connected to each other with an interface. LTE specifications call such an interface as X2 interface. In IEEE 802.11 networks, a similar interface may be provided between access points. Other wired or wireless communication methods between the access nodes may also be possible. The access nodes may be further connected via another interface to a core network 130 of the cellular communication system. The LTE specifications specify the core network as an evolved packet core (EPC), and the core network may comprise a mobility management entity (MME) 132 and a gateway (GW) node 134. The MME may handle mobility of terminal devices in a tracking area encompassing a plurality of cells and also handle signalling connections between the terminal devices and the core network 130. The gateway node 134 may handle data routing in the core network 130 and to/from the terminal devices. In some scenarios, the different access nodes may be connected to different core networks. The different core networks may be operated by the same operator or by different operators.

The radio system of FIG. 1 may support Machine Type Communication (MTC). MTC may enable providing service for a large amount of MTC capable devices, such as the at least one terminal device 120. The at least one terminal device 120 may comprise a mobile phone, smart phone, tablet computer, laptop or other devices used for user communication with the radio communication network, such as an MTC network. These devices may provide further functionality compared to the MTC scheme, such as communication link for voice, video and/or data transfer. However, in MTC perspective the at least one terminal device 120 may be understood as a MTC device. It needs to be understood that the at least one terminal device 120 may also comprise another MTC capable device, such as a sensor device providing position, acceleration and/or temperature information to name a few examples. Some embodiments of the invention may thus be applicable to Internet of Things (IoT) systems, e.g. a radio access technology supporting a narrowband IoT (NB-IoT) communication scheme.

FIG. 1 illustrates an infrastructure-based communication scenario with a fixed access node 110 providing a mobile terminal device 120 with radio access. Another perspective in wireless communications involves wireless links between mobile devices 120, 122. The devices 120, 122 may be peer devices in the sense that the devices 120, 122 may be the end points of the connection. In another scheme, one of the devices 120 may provide the other device 120 with wireless access to the infrastructure. Accordingly, the device providing the access may be understood as a mobile access node. Such a scheme is sometimes called tethering.

Channel encoding is commonly in wireless communication links to combat signal degradation in a radio channel. The channel encoding is typically based on processing data bits in a channel encoder and outputting encoded data bits to further processing in a radio transmitter. The channel encoder typically outputs bits at a higher data rate than a data rate at its input. In other words, the channel encoder computes additional information from the data bits. A systematic channel coding scheme maintains the original data bits at its output and, additionally, outputs parity bits that may be used as additional information in a channel decoder. The low-density parity check (LDPC) codes described in the Background section are an example of such channel codes. In many wireless links, an automatic repeat request (ARQ) scheme is also used for retransmissions related to data not being successfully decoded in a receiver. The ARQ scheme is based on the receiver acknowledging (ACK) successful decoding of the data to the transmitter. Some systems employ also negative acknowledgments (NACK/NAK) for the receiver to indicate the failed decoding of the data. Other systems do not employ the NACK/NAK. In such systems, upon not receiving the ACK within a determined time window from the transmission, the transmitter carries out a retransmission.

Figure 2:
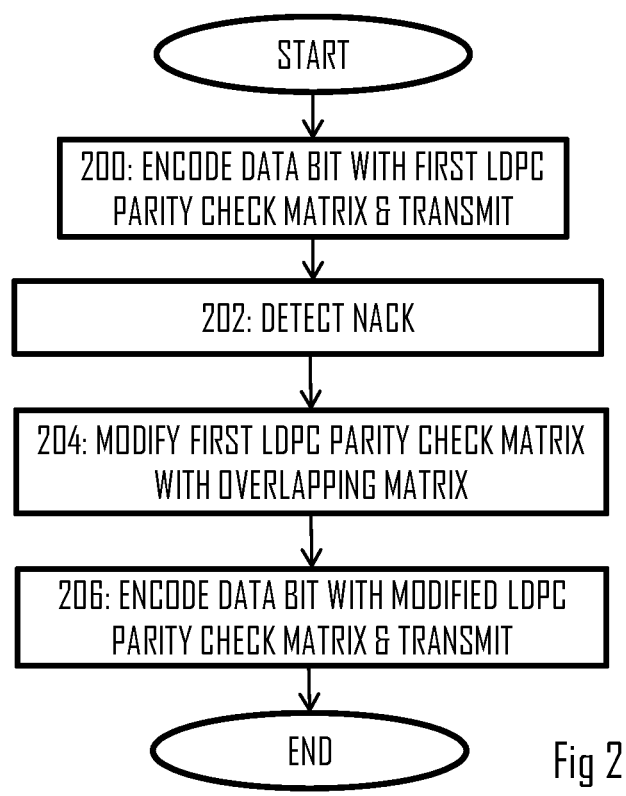
FIGS. 2 and 3 illustrate flow diagrams of processes for encoding and decoding procedures in connection with an automated repeat request (ARQ) process according to some embodiments of the invention.
Figure 3:
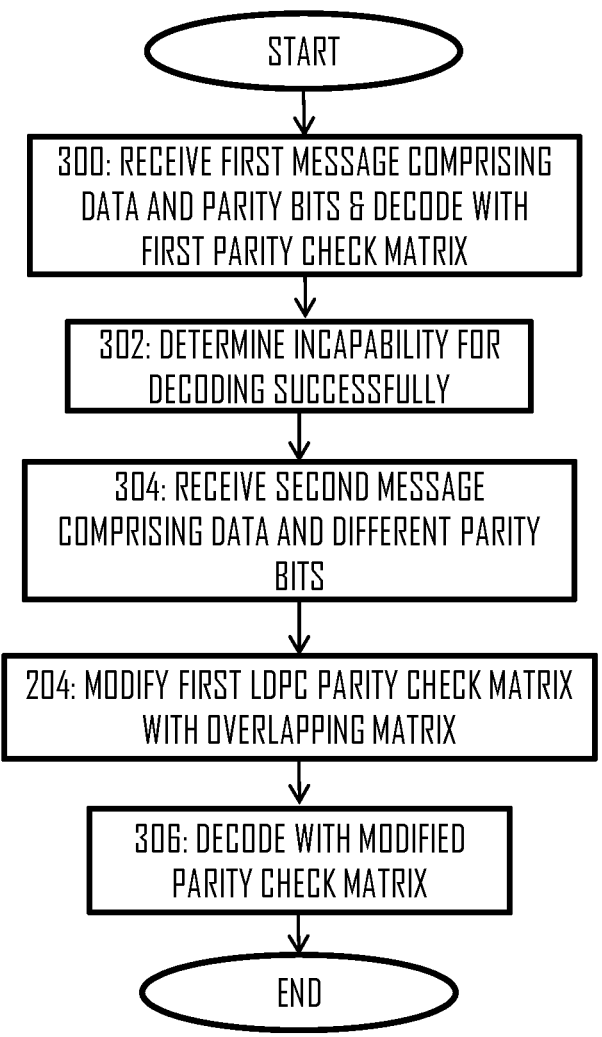

Embodiments of the present invention employ the LDPC channel codes in connection with an ARQ process. The ARQ process used in the described embodiments is a hybrid ARQ process where the transmitter may transmit different information in an initial transmission and in retransmission. FIGS. 2 and 3 illustrate some embodiments of processes for combining the use of LDPC codes with HARQ. FIG. 2 illustrates the process from a viewpoint of a transmitter apparatus, while FIG. 3 illustrates the process from a viewpoint of a receiver apparatus.

Referring to FIG. 2, the process comprises in an apparatus: encoding a data bit set by using a first parity check matrix in a low-density parity check encoder, thus providing a first parity bit set (block 200); causing transmission of the data bit set and at least some parity bits of the first parity bit set to a second apparatus in a message (block 200); determining that the second apparatus was not capable of decoding the data bit set (block 202); modifying the first parity check matrix by using an overlapping matrix such that overlapping elements of the first parity check matrix and the overlapping matrix are combined, thus acquiring a second parity check matrix (block 204); encoding the data bit set by using the second parity check matrix in the low-density parity check encoder, thus providing a second parity bit set (block 206); and causing transmission of at least some parity bits of the second parity bit set to the second apparatus (block 206).

In an embodiment, the combining is carried out by using one of the following combining methods: a sum, a modulo-2 sum, a logical binary OR operation, or a logical binary exclusive OR (XOR) operation. Other solutions for carrying out a function where a similar combining effect is realized may equally be used. For example, any rule that combines values '0' and '1' to value '1' and values '0' and '0' to a value '0' may be used. The first parity check matrix and the overlapping matrix may be designed so that no combining of values '1' and '1' is needed because a purpose may be to have more values '1' in the second parity check matrix than in the first parity check matrix (see description below).

Referring to FIG. 3, the process comprises in an apparatus: receiving, from a second apparatus, a first message comprising a data bit set and a first parity bit set (block 300); decoding, by the first apparatus in a low-density parity check decoder, the data bit set by using the first parity bit set and a first parity check matrix known to be used for encoding the data bit set in the second apparatus (block 300); determining that the low-density parity check decoder was not capable of decoding the data bit set (block 302); receiving, from the second apparatus, a second message comprising a second parity bit set different from the first parity bit set (block 304); modifying the first parity check matrix by using an overlapping matrix such that overlapping elements of the first parity check matrix and the overlapping matrix are summed, thus acquiring a second parity check matrix (block 206); and decoding, in the low-density parity check decoder, the data bit set by using at least the second parity bit set and the second parity check matrix (block 306).

Figure 4:
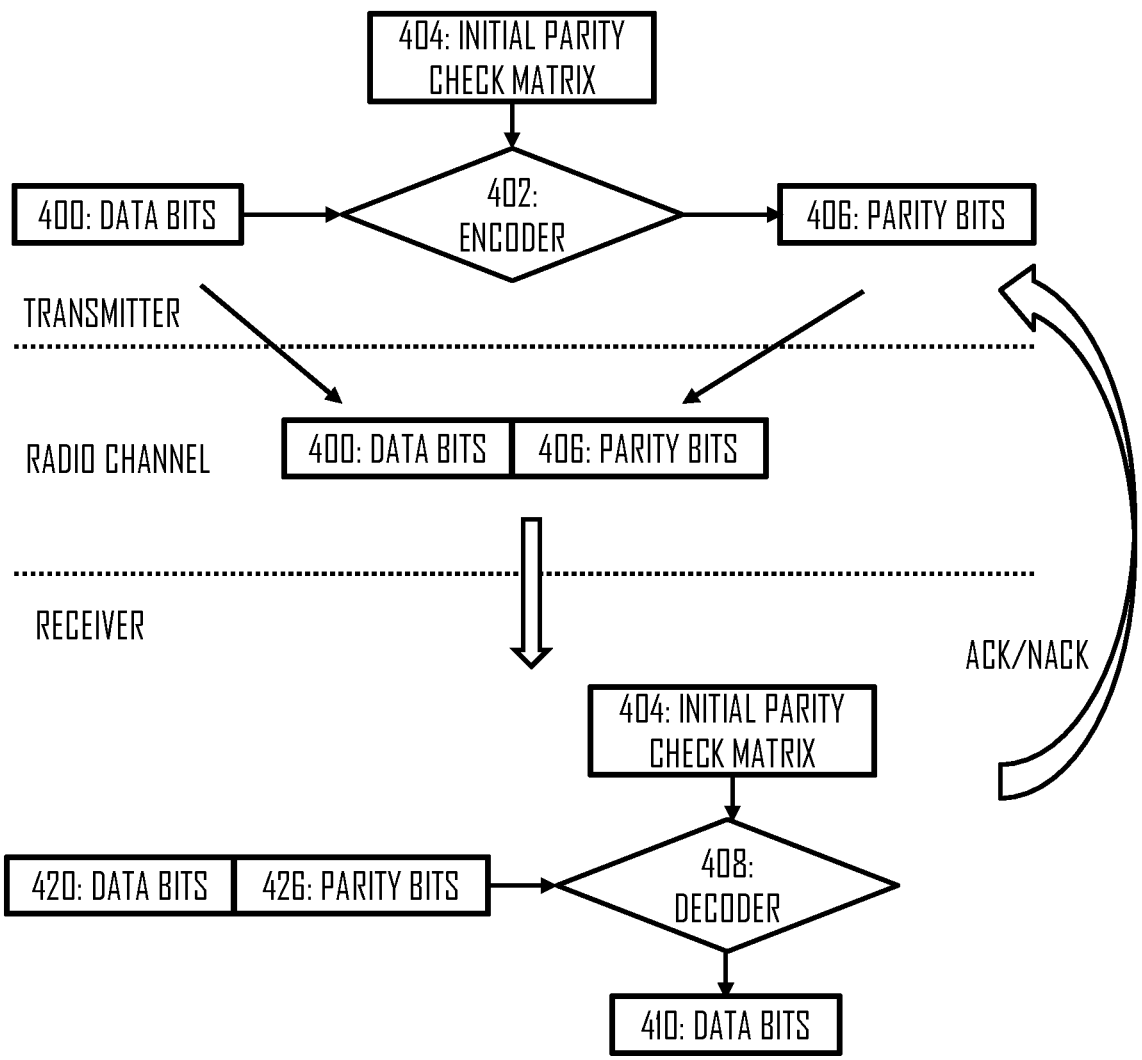
FIG. 4 illustrates encoding and decoding in connection with an initial transmission of a message according to an embodiment of the invention.
Figure 5:
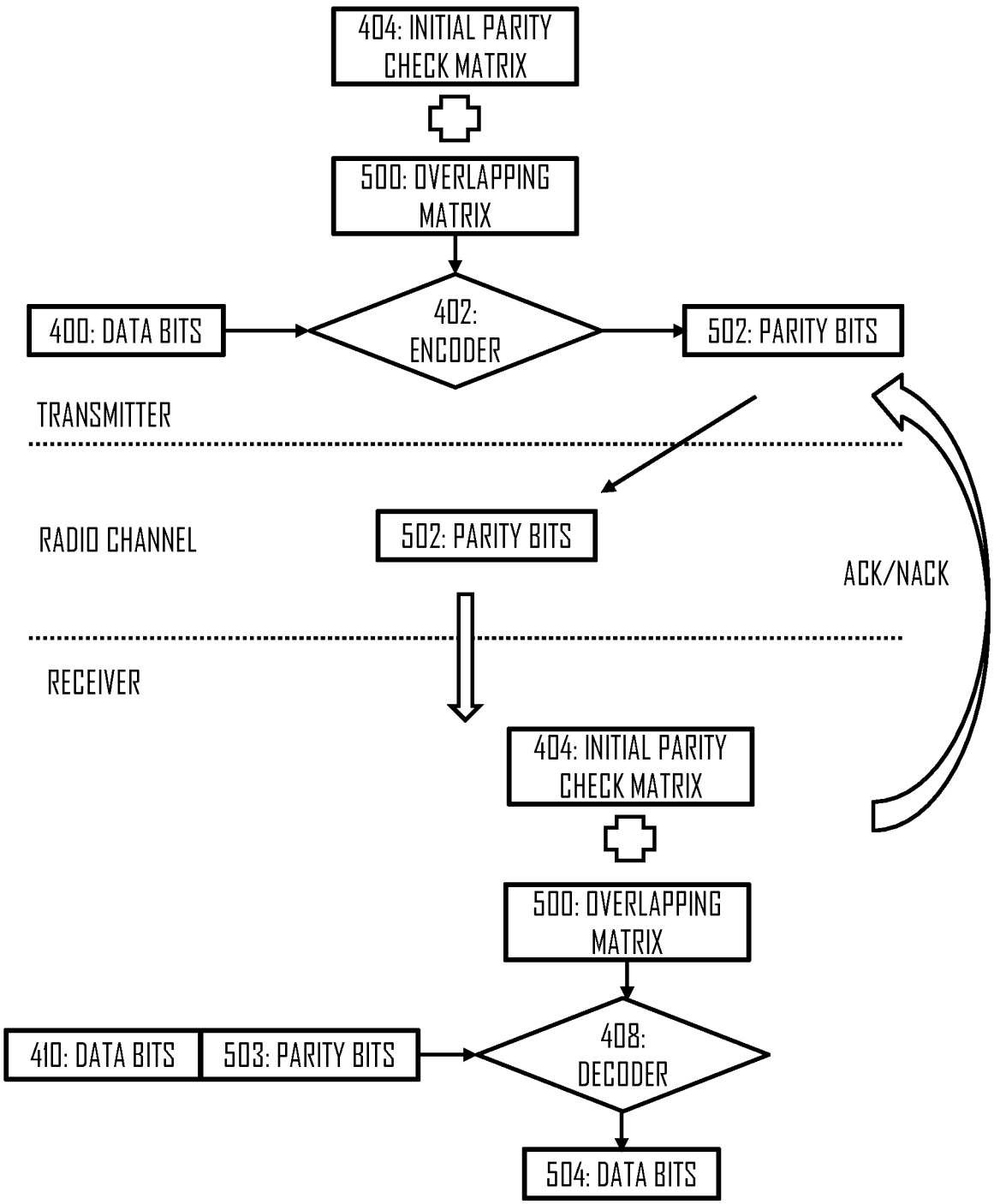
FIG. 5 illustrates encoding and decoding in connection with a first retransmission of according to an embodiment of the invention.
Figure 6:
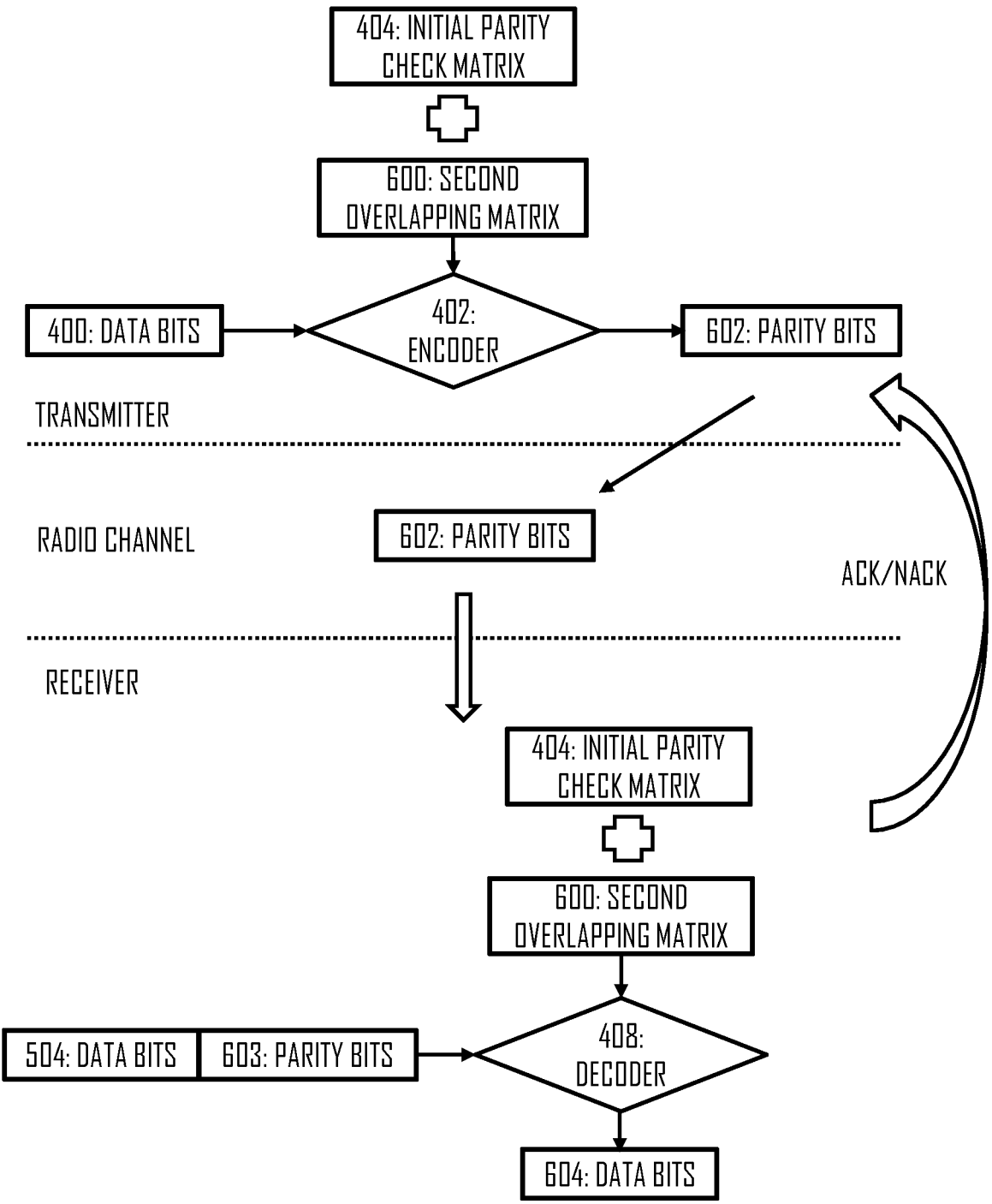
FIG. 6 illustrates encoding and decoding in connection with a second retransmission according to an embodiment of the invention.
Figure 7:
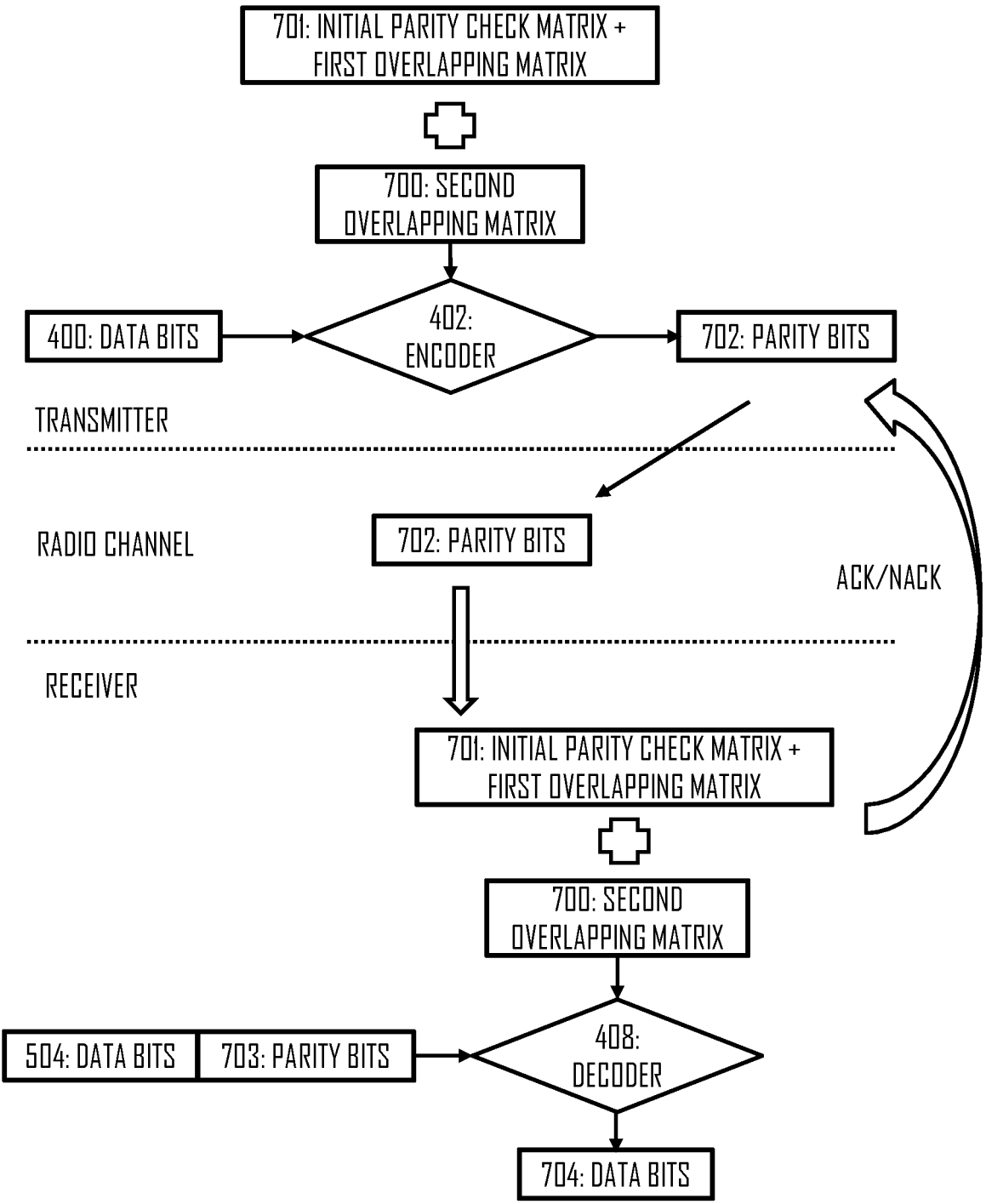
FIG. 7 illustrates encoding and decoding in connection with a second retransmission according to another embodiment of the invention.

As described above, the parity check matrix is recomputed after the initial transmission, and parity bits acquired from the recomputed parity check matrix are transmitted in the retransmission. Such additional processing of the parity check matrix may improve the decoding performance compared with a scheme where only parity bits of the initial parity check matrix are used in the retransmission. Let us now describe the encoding and decoding in connection with the HARQ process in greater detail with reference to FIGS. 4 to 7. FIGS. 4 to 7 illustrate encoding in a transmitter and decoding in a receiver of data bits. The transmitter and the receiver may be formed from any combination of the devices 110, 120, 122 of FIG. 1. FIG. 4 illustrates encoding and decoding in connection with the initial transmission of data bits, and FIGS. 5 to 7 illustrate the encoding and decoding in connection with the retransmissions.

Referring to FIG. 4, data bits 400 to be transmitted from a transmitter to a receiver are encoded in an LDPC encoder 402. The LDPC encoder 402 as such may be a state-of-the-art LDPC encoder. An initial parity check matrix 404 input to the encoder 402 for the computation of the parity bits 406 for the initial transmission may be a quasi-cyclic (QC) LDPC parity check matrix. An embodiment of such a matrix is provided in Table 1 below:

TABLE 1

| 6 | 38 | 3 | 93 | | | | 30 | | | 86 | | 38 | | 11 | | 46 | 48 | 0 | | | | | |
|---|----|---|----|--|--|--|----|--|--|----|--|----|--|----|--|----|----|---|--|--|--|--|--|
| 62 | | 19 | 84 | | 78 | | 15 | | | | | 45 | 23 | 32 | 30 | | 0 | 0 | | | | | |
| 71 | | 55 | | 66 | 45 | 79 | | 78 | | | | 22 | 55 | 70 | | | | 0 | 0 | | | | |
| | 61 | | | 9 | 73 | | 64 | | 39 | 61 | 43 | | | | | 32 | 0 | | | 0 | 0 | | |
| | | | | 32 | 52 | 55 | | 95 | 22 | | 51 | 24 | | 44 | | | | | | | 0 | 0 | |
| | 63 | | | 88 | 20 | | | | 6 | | 56 | 16 | 71 | 53 | | 26 | 48 | | | | | | 0 |

Each "box" in Table 1 may represent a sub-matrix called a protograph matrix of size W*W. Accordingly, the initial parity check matrix 404 in this example consists of 6 W rows and 24 W columns. Some of the protograph matrices may be identity matrices wherein elements of the matrix are cyclically shifted according to the number indicated in Table 1. For example, number 1 may indicate that values of the identity matrix are cyclically shifted by one element, thus resulting in the following matrix representation (assuming W=3):

| 0 | 1 | 0 |
|---|---|---|
| 0 | 0 | 1 |
| 1 | 0 | 0 |

Consequently, the cyclic shift may be understood as shifting the values along each row in a cyclic manner such that the last value on a row is shifted to the beginning of the row. In this case, the cyclic shft is to the right but it could equally be to the left. This is an overly simplified example with a small value of W and, in real implementations, W may be much higher. W may depend on the design of the encoder but, in any case, it may be higher than the highest value in the boxes of Table 1. Protograph matrices in Table 1 having value "0" (zero) may be identity matrices of size (W, W) with no cyclic shift. Protograph matrices in Table 1 having no value may be zero matrices of size (W, W) containing all zero elements. Accordingly, the initial parity check matrix may comprise protograph matrices that are zero matrices and protograph matrices that are non-zero matrices, e.g. cyclically shifted identity matrices.

In Table 1, the first 18 columns may represent a systematic section of the parity check matrix producing systematic (data) bits at the output of the encoder 402, and the last six columns may represent a parity check section of the parity check matrix generating the parity bits 406 from the input data bits 400. It should be appreciated that Table 1 represents only an example of the parity check matrix, and another parity check matrix may be generated by using a different combination of cyclically shifted protograph matrices. Also, the size of the matrix is dependent on the implementation.

After processing the data bits 400 with the initial parity check matrix 404, the LDPC encoder 402 outputs the parity bits 406. The data bits 404 and the parity bits 406 may be transmitted in a message through a radio channel to the receiver. We remind that further transmitter and receiver components are typically provided between the encoder 402 and a decoder 408 to carry out signal processing related to the transmission and reception of radio signals, but these components have been omitted from FIGS. 4 to 7 for the sake of clarity of description. In the radio channel, the data bits and the parity bits 406 transmitted from the transmitter are corrupted by noise and, thus, modified into corrupted data bits 420 and corrupted parity bits 426. In the decoder, the data bits 420 and the parity bits 426 received from the radio channel through receiver components of the receiver are input to the decoder 408. The decoder 408 may use the same initial LDPC parity check matrix 404 of Table 1 as another input in the decoding and carry out the decoding. The decoder 408 as such may be a state-of-the-art LDPC decoder. The LDPC decoder 408 may output estimated data bits 410 representing estimates of the transmitted data bits 400, e.g. as soft values. The soft values may represent the values of the data bits as non-integer probability values between zero and one. After the decoding, it may be determined whether or not the estimated data bits 410 correspond to the transmitted data bits 400. This may be carried out by using a cyclic redundancy check (CRC), for example. IF the CRC shows success, the data bits 400 have been successfully recovered, and the receiver may send a positive acknowledgment (ACK) to the transmitter. If the CRC shows failure, the data bits 400 have not been recovered, and the receiver may send a negative acknowledgment (NACK) to the transmitter or, in some systems, send no acknowledgment.

In some embodiments, the transmitter may transmit only a subset of parity bits generated by the encoder 402. The operation of the transmitter and the receiver may be aligned such that both devices have the knowledge of which parity bits are transmitted and available to the receiver for the decoding.

FIG. 5 illustrates the next step of the procedure after failed recovery of the data bits 400 in the receiver, e.g. upon the transmitter determines that the decoding has failed in the receiver. This may be determined by receiving the NACK or not receiving an ACK. Upon determining that the retransmission is needed, the transmitter may modify the initial parity check matrix 404 and generate a new parity check matrix. In an embodiment, the new parity check matrix is a combination of the initial parity check matrix 404 and an overlapping matrix 500. The overlapping matrix 500 may be considered as a matrix that is overlapped with the initial parity check matrix 404, Table 2 below illustrates an embodiment of the overlapping matrix.

TABLE 2

|    |    |    | 80 | 6  |    | 90 | 20 |
|----|----|----|----|----|----|----|----|
| 38 |    | 66 | 47 |    |    |    | 94 |
|    | 31 |    |    | 41 |    |    | 27 |
| 94 |    | 92 |    |    | 92 |    |    |
|    |    |    |    | 90 |    | 37 | 4  |
|    | 12 |    |    |    | 10 |    | 82 |

In this embodiment, the overlapping matrix 500 may be of the same size as the initial parity check matrix 404. In that case, the overlapping matrix overlaps fully with the initial parity check matrix. In another embodiment, the overlapping matrix 500 may be of different size, e.g. smaller than the initial parity check matrix 404. Accordingly, the overlapping matrix 500 overlaps with the initial parity check matrix only partially. In such a case, the positioning of the overlapping between the two matrices may be selected according to implementation, and only the overlapping elements are combined, e.g. summed together. The values in Table 2 have the same meaning as in Table 1, i.e. cyclic shifts of the identity matrix.

The combining may be considered on different levels of notation in a slightly different manner. For example, when using the protograph notation used in Tables 1 and 2 above where a single box represents a protograph matrix, the combination may be carried out by applying the values of the overlapping matrix of Table 2 to the corresponding locations in the initial parity check of Table 1 such that the original value of the initial parity check matrix is also maintained. For example, a value of the box on the second row, first column of the combined matrix would become (62, 38) where '62' is obtained from the initial parity check matrix and '38' from the overlapping matrix. However, when using a full matrix notation where the protograph matrices are expanded into "real" binary LDPC matrices, the combining may be summation, modulo-2 summation, or another combination of binary values of the binary matrices.

The effect of using the overlapping matrix 500 combined with the initial parity check matrix 404 is that some protograph matrices of the new parity check matrix have more than one cyclic non-zero diagonals. Here is one example of such a protograph matrix with W=5:

| 1 | 0 | 0 | 1 | 0 |
| 0 | 1 | 0 | 0 | 1 |
| 1 | 0 | 1 | 0 | 0 |
| 0 | 1 | 0 | 1 | 0 |
| 0 | 0 | 1 | 0 | 1 |

The new parity check matrix may be computed beforehand and stored in a memory of the transmitter. Now, the transmitter may use the encoder 402 to re-encode the data bits 400. Since the parity check matrix is different from the one used in the initial transmission in FIG. 4, new parity bits 502 are generated. The message forming the retransmission may comprise only the new parity bits 502, or a subset thereof, without the systematic data bits 400. In other embodiments, also the systematic bits may be transmitted in the retransmission. Accordingly, the retransmission may utilize incremental redundancy by providing the receiver with additional parity bits to help the decoding of the data bits, and the parity bits are encoded by using a different parity check matrix than used in connection with the initial transmission.

Again, the parity bits 502 are corrupted by noise in the channel, and the receiver receives corrupted parity bits 503. The receiver may input the corrupted parity bits to the decoder together with the soft values of the decoded data bits 410 acquired as a result of decoding the received message of the initial transmission. Another input to the decoder 408 may be the new parity check matrix formed in the receiver in the same manner as in the transmitter by combining the initial parity check matrix 404 with the overlapping matrix 500. The receiver may also store the resulting parity check matrix beforehand in order to reduce computation at the time of performing the decoding. As a result of the decoding, the decoder 408 outputs new estimates of the transmitted data bits 504.

Now, the receiver may check the decoded parity bits or run another CRC to verify whether or not the estimated data bits 504 are the transmitted data bits 400. If the result indicates successful decoding, the receiver may send ACK to the transmitter. Otherwise, the decoder still has not successfully decoded the data bits, and the receiver may send NACK to the transmitter or send no ACK.

FIGS. 6 and 7 illustrate alternative embodiments for the second retransmission. FIG. 6 illustrates an embodiment where the transmitter combines the initial parity check matrix 404 with a different overlapping matrix, and FIG. 7 illustrates an embodiment where the transmitter combines a new overlapping matrix with the new parity check matrix that resulted in FIG. 5 from the combining of the overlapping matrix 500 and the initial parity check matrix 404. The embodiment of FIG. 6 provides a less complex solution, and the embodiment of FIG. 7 provides a parity check matrix that has one or more protograph matrices having even a higher weight, e.g. a higher number of non-zero diagonals.

Referring to FIG. 6, upon detecting that the receiver was incapable of correctly decoding the data bits 400 after the first retransmission, e.g. upon receiving the NACK or not receiving an ACK for the first retransmission, the transmitter may configure the encoder 402 to re-encode the data bits 400. In this embodiment, the other input to the encoder 402 is a further modified parity check matrix computed as a combination of the initial parity check matrix 404 and a second overlapping matrix 600. The second overlapping matrix 600 may be different from the first overlapping matrix 500 described in connection with FIG. 5. The matrices 500 and 600 may be of different size and/or have different element values. In case of different size of the overlapping matrix, the overlapping matrix may be aligned with the initial parity check matrix by aligning their top left (or top right) corners with one another, or another reference location of both matrices. Table 3 below illustrates an embodiment of the overlapping matrix.

TABLE 3

| 8 | 46 |    | 6  |    |    | 18 | 23 |
|---|----|----|----|----|----|----|----|
|   | 30 | 66 |    |    |    | 70 | 2  |
|   |    | 21 | 41 |    |    | 80 | 10 |
|   | 45 | 1  |    | 13 |    |    | 11 |
|   |    | 15 |    |    | 24 | 8  |    |
| 72| 17 |    |    | 10 |    |    |    |

The overlapping matrix 600 generates a final parity check matrix where the protograph matrices having multiple non-zero diagonals are at different locations than in the embodiment of FIG. 5. Also in this embodiment, the overlapping matrix 600 may be of the same size as the initial parity check matrix 404. In that case, the overlapping matrix overlaps fully with the initial parity check matrix. In another embodiment, the overlapping matrix 600 may be of different size, e.g. smaller than the initial parity check matrix 404. Accordingly, the overlapping matrix 600 overlaps with the initial parity check matrix only partially. In such a case, the positioning of the overlapping between the two matrices may be selected according to implementation, and only the overlapping elements are summed together. The values in Table 3 have the same meaning as in Tables 1 and 2, i.e. cyclic shifts of the identity matrix.

As in the embodiment of FIG. 5, the new parity check matrix resulting from the combination of the matrices 404, 600 may be computed beforehand and stored in a memory of the transmitter. Now, the transmitter may use the encoder 402 to re-encode the data bits 400. Since the parity check matrix is different from the ones used in the initial transmission in FIG. 4 and in the first retransmission in FIG. 5, new parity bits 602 are generated. A message forming the second retransmission may comprise only the new parity bits 602, or a subset thereof, without the systematic data bits 400.

Again, the parity bits 602 are corrupted by noise in the channel, and the receiver receives corrupted parity bits 603. The receiver may input the corrupted parity bits 603 to the decoder together with the soft values of the decoded data bits 504 acquired as a result of decoding the received message of the initial transmission and the first retransmission. Another input to the decoder 408 may be the new parity check matrix formed in the receiver in the same manner as in the transmitter by combining the initial parity check matrix 404 with the second overlapping matrix 600. The receiver may also store the resulting parity check matrix beforehand in order to reduce computation at the time of performing the decoding. As a result of the decoding, the decoder 408 outputs new estimates of the transmitted data bits 604.

Now, the receiver may run another CRC to verify whether or not the estimated data bits 604 are the transmitted data bits 400. If the result indicates successful decoding, the receiver may send ACK to the transmitter. Otherwise, the decoder still has not successfully decoded the data bits, and the receiver may send NACK to the transmitter or send no ACK.

Let us now consider the embodiment of FIG. 7. Referring to FIG. 7, upon detecting that the receiver was incapable of correctly decoding the data bits 400 after the first retransmission, e.g. upon receiving the NACK or not receiving an ACK for the first retransmission, the transmitter may configure the encoder 402 to re-encode the data bits 400. In this embodiment, the other input to the encoder 402 is a further modified parity check matrix computed as a combination of the parity check matrix input to the encoder 402 in connection with the first or previous retransmission (see FIG. 5), this matrix denoted by 701 in FIG. 7, and a second overlapping matrix 700. Please note that this embodiment is alternative to the embodiment of FIG. 6 so the overlapping matrices 600 and 700 may be logically different matrices, although an embodiment they may be the same matrix. The second overlapping matrix 700 may also be different from the first overlapping matrix 500 described in connection with FIG. 5. The matrices 500 and 700 may be of different size and/or have different element values. Table 4 below illustrates an embodiment of the overlapping matrix.

TABLE 4

|    |    |    |    | 14 |    |    | 56 |    |    |
|----|----|----|----|----|----|----|----|----|----|
| 17 | 37 |    | 33 |    |    |    |    | 10 |    |
|    | 6  |    |    |    | 59 |    |    | 13 |    |
|    |    | 26 |    |    |    | 28 |    |    |    |
|    |    |    | 63 |    | 10 |    | 7  |    |    |
|    | 41 |    |    |    |    |    | 20 |    | 13 |

The overlapping matrix 700 generates a final parity check matrix having some protograph matrices having two non-zero diagonals (weight two) and even some protograph matrices having three non-zero diagonals (weight three). As already illustrated above below Table 2, the number of non-zero diagonals may be considered in the cyclic manner because the protograph matrices are cyclically shifted identity matrices. Also in this embodiment, the overlapping matrix 700 may be of the same size as the initial parity check matrix 404. In that case, the overlapping matrix overlaps fully with the initial parity check matrix. In another embodiment, the overlapping matrix 700 may be of different size, e.g. smaller than the initial parity check matrix 404. Accordingly, the overlapping matrix 700 overlaps with the initial parity check matrix only partially. In such a case, the positioning of the overlapping between the two matrices may be selected according to implementation, and only the overlapping elements are summed together. The values in Table 4 have the same meaning as in Tables 1 to 3, i.e. cyclic shifts of the identity matrix.

As in the embodiments of FIGS. 5 and 6, the new parity check matrix resulting from the combination of the matrices 700, 701 may be computed beforehand and stored in a memory of the transmitter. Now, the transmitter may use the encoder 402 to re-encode the data bits 400. Since the parity check matrix is different from the ones used in the initial transmission in FIG. 4 and in the first retransmission in FIG. 5, new parity bits 702 are generated. A message forming the second retransmission may comprise only the new parity bits 702, or a subset thereof, without the systematic data bits 400.

Again, the parity bits 702 are corrupted by noise in the channel, and the receiver receives corrupted parity bits 703. The receiver may input the corrupted parity bits 603 to the decoder together with the soft values of the decoded data bits 504 acquired as a result of decoding the received message of the initial transmission and the first retransmission. Another input to the decoder 408 may be the new parity check matrix formed in the receiver in the same manner as in the transmitter by combining the matrices 701 and 700 by using modulo-2 summing. The receiver may also store the resulting parity check matrix beforehand in order to reduce computation at the time of performing the decoding. As a result of the decoding, the decoder 408 outputs new estimates of the transmitted data bits 704.

Now, the receiver may run another CRC or otherwise verify whether or not the estimated data bits 704 are the transmitted data bits 400. If the result indicates successful decoding, the receiver may send ACK to the transmitter. Otherwise, the decoder still has not successfully decoded the data bits, and the receiver may send NACK to the transmitter or send no ACK.

If the second retransmission still results in a failure in the correct decoding of the data bits, the procedure may be continued according to the embodiment of FIG. 6 or 7 by generating yet another parity check matrix. By following the embodiment of FIG. 6, the new parity check matrix is generated from the initial parity check matrix 404 and yet another version of the overlapping matrix. In the embodiment of FIG. 7, the parity check matrix of the previous retransmission is used as a template for the new parity check matrix. The template is modified with a new overlapping matrix that provides yet additional weight (non-zero diagonal) to one or more protograph matrices of the template. In this manner, the procedure may continue until the data bits 400 have been correctly recovered or after a retransmission limit is reached, for example.

It should be noted retransmission order listed here as first, second, and so on is simplified from a more general case on Nth, Nth+1 and so on. Nth retransmission may use the parity check matrix mentioned in this document in connection with the first retransmission. Nth+1 retransmission may employ a parity check matrix described in connection with the second retransmission. A retransmission prior to the Nth may retransmission use other retransmission schematics, e.g. a prior art parity check matrix.

Tables 1 to 4 illustrate just examples of the possible constructions of the parity check matrices. There exist numerous other variants of the parity check matrices that may work equally well or even better, and virtually any parity check matrix may be generated according to the principles described above. The principles may include providing the initial parity check matrix with weight 1, indicating that the protograph matrices include zero matrices and matrices having a single cyclic non-zero diagonal. The principles may further include that a modified parity check matrix used in a retransmission may, additionally, include at least one protograph matrix having multiple cyclic non-zero diagonals.

In the embodiments described above, the parity check matrix is modified between the retransmissions, and parity bits of different transmissions are acquired from different parity check matrices. In another embodiment, at least one retransmission comprises parity bits acquired from the same parity check matrix as at least one previous (re)transmission but that the parity bits are different from parity bits transmitted in the at least one previous transmission. For example, the first retransmission may comprise parity bits acquired according to the embodiment of FIG. 4 on the basis of the initial parity check matrix 404 only but the parity bits may be different from the parity bits 406 transmitted in the initial transmission. The same principle may be applied to any retransmission. For example, a retransmission subsequent to a retransmission carried out according to any one of the embodiments of FIG. 5, 6, or 7 may comprise parity bits acquired by using the same modified parity check matrix as used in the previous retransmission.

Figure 8:
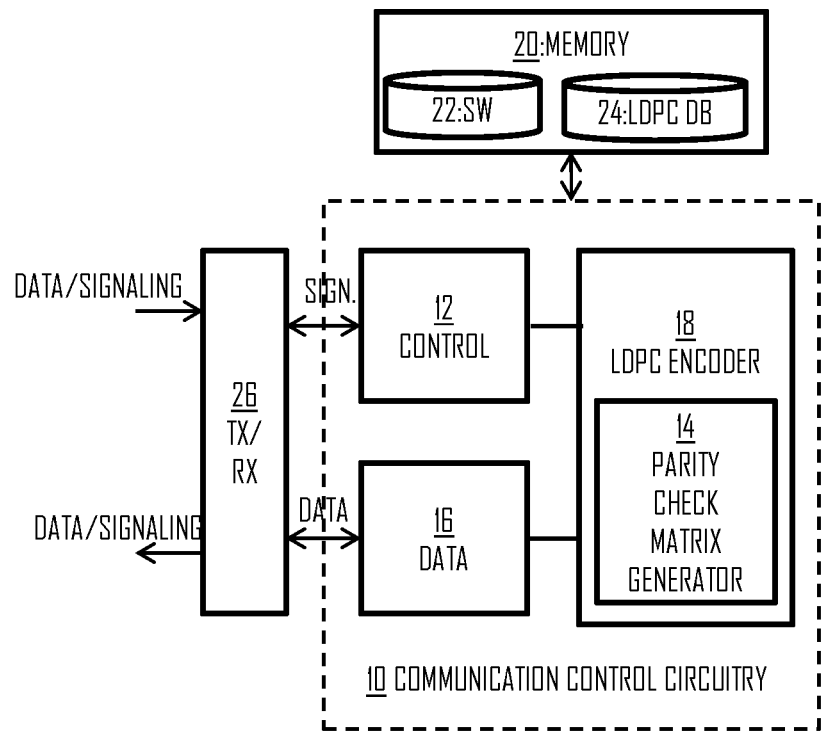
FIGS. 8 and 9 illustrate block diagrams of apparatuses according to some embodiments of the invention.
Figure 9:
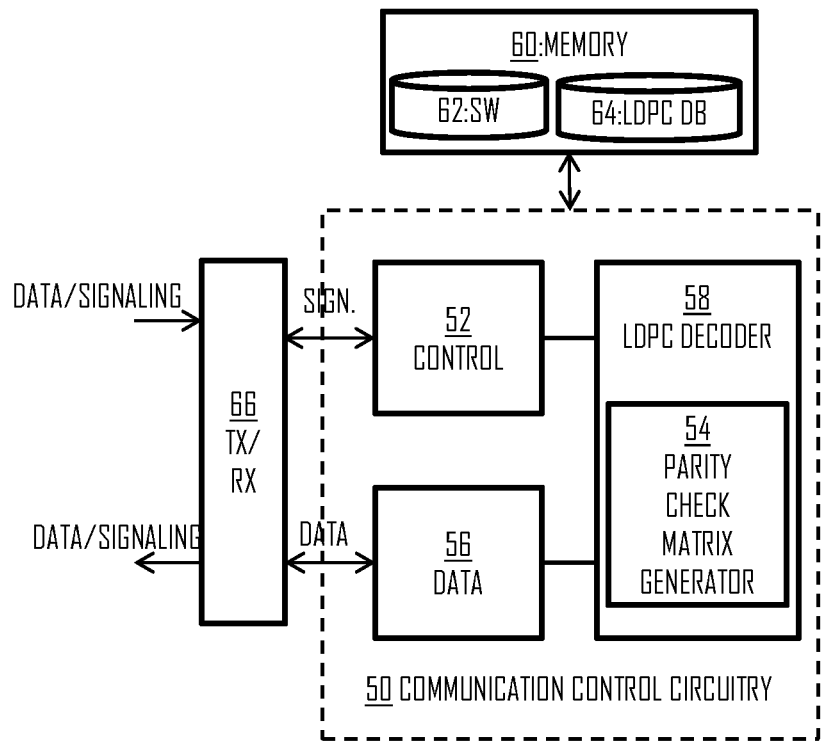

FIGS. 8 and 9 illustrate block diagrams of apparatuses according to some embodiments of the invention. FIG. 8 illustrates the transmitter apparatus comprising an encoder and FIG. 9 illustrates the receiver apparatus comprising a decoder. It should be appreciated that in many implementations an apparatus comprises both the encoder and the decoder so the apparatus may be considered as a combination of the embodiments of FIGS. 8 and 9. Since the description of embodiments in this document uses the viewpoint of the transmitter and the receiver, the same form of description is maintained with FIGS. 8 and 9. The apparatus of FIGS. 8 and/or 9 may be any one of the above-described apparatuses, e.g. the access node 110 or a terminal device 120 or a peer device 122, or the apparatus may be comprised in any one of the above-described apparatuses. The apparatus may be, for example, a circuitry or a chipset in any one of the apparatuses 110, 120, 122. The apparatus may be an electronic device comprising electronic circuitries.

Referring to FIG. 8, the apparatus may comprise a communication control circuitry 10 such as at least one processor, and at least one memory 20 including a computer program code (software) 22 wherein the at least one memory and the computer program code (software) are configured, with the at least one processor, to cause the apparatus to carry out any one of the embodiments of the transmitter described above.

The memory 20 may be implemented using any suitable data storage technology, such as semiconductor based memory devices, flash memory, magnetic memory devices and systems, optical memory devices and systems, fixed memory and removable memory. The memory may comprise a configuration database 24 for storing configuration data for the encoder 402. For example, the configuration database 24 may store the LDPC parity check matrices for encoding the data bits at different stages of the ARQ process, e.g. in the initial transmission, first retransmission, second retransmission, etc.

The apparatus may further comprise a communication interface (TX/RX) 26 comprising hardware and/or software for realizing communication connectivity according to one or more communication protocols. The communication interface 26 may provide the apparatus with communication capabilities to communicate in the cellular communication system and/or in another wireless network. Depending on whether the apparatus is configured to operate as a terminal device, a peer device, or an access node, and depending on a radio access technology, the communication interface may provide different functions. The communication interface 26 may comprise standard well-known components such as an amplifier, filter, frequency-converter, (de)modulator, and encoder/decoder circuitries and one or more antennas. The communication interface 26 may comprise radio interface components providing the apparatus with radio communication capability in one or more wireless networks.

Referring to FIG. 8, the communication control circuitry 10 may comprise a transmission controller 12 configured to carry out control plane signalling such as transmission and reception of control or management messages. Such messages may include link establishment messages, link management messages, link termination messages, handover messages, measurement messages, beacon or pilot signals, etc. The communication control circuitry 10 may further comprise a data communication circuitry 16 configured to carry out user plane or data plane communication with the terminal devices.

The communication control circuitry 10 may further comprise an LDPC encoder 18 configured to encode control plane and/or data plane messages before transmission through the communication interface 26. The LDPC encoder 18 may incorporate the encoder 402 described above and, additionally, it may include a parity check matrix generator 14 configured to generate the parity check matrix for the encoder 402 in the above-described manner. The parity check matrix generator 14 may be configured to determine whether a message currently being processed for transmission is an initial transmission of a message, a first retransmission, a second retransmission, etc. and select the appropriate LDPC parity check matrix, as described above in connection with FIGS. 4, 5, and 6 or 7. Upon encoding data bits of the message by using the LDPC parity check matrix, the LDPC encoder 18 may output the data bits and/or the parity bits for further processing.

In an embodiment, the apparatus of FIG. 8 comprises at least one processor 10 and at least one memory 20 including a computer program code 22, wherein the at least one memory and the computer program code are configured, with the at least one processor, to cause the apparatus to carry out the functionalities of the transmitter according to any one of the embodiments of FIGS. 2 and 4 to 7. According to an aspect, when the at least one processor 10 executes the computer program code, the computer program code causes the apparatus to carry out the functionalities according to any one of the embodiments of FIGS. 2 and 4 to 7. According to another embodiment, the apparatus comprises the at least one processor 10 and at least one memory 20 including a computer program code 22, wherein the at least one processor 10 and the computer program code 22 perform the at least some of the functionalities of the transmitter according to any one of the embodiments of FIGS. 2 and 4 to 7. Accordingly, the at least one processor, the memory, and the computer program code form processing means for carrying out embodiments of the present invention in the transmitter. According to yet another embodiment, the apparatus carrying out the embodiments of the invention in the transmitter comprises a circuitry including at least one processor 10 and at least one memory 20 including computer program code 22. When activated, the circuitry causes the apparatus to perform the at least some of the functionalities of the transmitter according to any one of the embodiments of FIGS. 2 and 4 to 7.

Referring to FIG. 9, the apparatus may comprise a communication control circuitry 50 such as at least one processor, and at least one memory 60 including a computer program code (software) 62 wherein the at least one memory and the computer program code (software) are configured, with the at least one processor, to cause the apparatus to carry out any one of the embodiments of the receiver described above.

The memory 60 may be implemented using any suitable data storage technology, such as semiconductor based memory devices, flash memory, magnetic memory devices and systems, optical memory devices and systems, fixed memory and removable memory. The memory may comprise a configuration database 64 for storing configuration data for the encoder 402. For example, the configuration database 64 may store the LDPC parity check matrices for encoding the data bits at different stages of the ARQ process, e.g. in the initial transmission, first retransmission, second retransmission, etc.

The apparatus may further comprise a communication interface (TX/RX) 66 comprising hardware and/or software for realizing communication connectivity according to one or more communication protocols. The communication interface 66 may provide the apparatus with communication capabilities to communicate in the cellular communication system and/or in another wireless network. Depending on whether the apparatus is configured to operate as a terminal device, a peer device, or an access node, and depending on a radio access technology, the communication interface may provide different functions. The communication interface 66 may comprise standard well-known components such as an amplifier, filter, frequency-converter, (de)modulator, and encoder/decoder circuitries and one or more antennas. The communication interface 26 may comprise radio interface components providing the apparatus with radio communication capability in one or more wireless networks.

Referring to FIG. 9, the communication control circuitry 50 may comprise a transmission controller 52 configured to carry out control plane signalling such as transmission and reception of control or management messages. Such messages may include link establishment messages, link management messages, link termination messages, handover messages, measurement messages, beacon or pilot signals, etc. The communication control circuitry 50 may further comprise a data communication circuitry 56 configured to carry out user plane or data plane communication with the terminal devices.

The communication control circuitry 50 may further comprise an LDPC decoder 58 configured to decode control plane and/or data plane messages received through the communication interface 66. The LDPC decoder 58 may incorporate the decoder 408 described above and, additionally, it may include a parity check matrix generator 54 configured to generate the parity check matrix for the decoder 408 in the above-described manner. The parity check matrix generator 54 may be configured to determine whether a message currently being processed is an initial transmission of a message, a first retransmission, a second retransmission, etc. and select the appropriate LDPC parity check matrix, as described above in connection with FIGS. 4, 5, and 6 or 7. Upon decoding data bits of the message successfully by using the LDPC parity check matrix, the LDPC decoder 58 may output the data bits for further processing.

In an embodiment, the apparatus of FIG. 9 comprises at least one processor 50 and at least one memory 60 including a computer program code 62, wherein the at least one memory and the computer program code are configured, with the at least one processor, to cause the apparatus to carry out the functionalities of the receiver according to any one of the embodiments of FIGS. 3 to 7. According to an aspect, when the at least one processor 50 executes the computer program code, the computer program code causes the apparatus to carry out the functionalities according to any one of the embodiments of FIGS. 3 to 7. According to another embodiment, the apparatus comprises the at least one processor 50 and at least one memory 60 including a computer program code 62, wherein the at least one processor 50 and the computer program code 62 perform the at least some of the functionalities of the receiver according to any one of the embodiments of FIGS. 3 to 7. Accordingly, the at least one processor, the memory, and the computer program code form processing means for carrying out embodiments of the present invention in the receiver. According to yet another embodiment, the apparatus carrying out the embodiments of the invention in the receiver comprises a circuitry including at least one processor 50 and at least one memory 60 including computer program code 62. When activated, the circuitry causes the apparatus to perform the at least some of the functionalities of the receiver according to any one of the embodiments of FIGS. 3 to 7.

As used in this application, the term 'circuitry' refers to all of the following: (a) hardware-only circuit implementations, such as implementations in only analog and/or digital circuitry, and (b) combinations of circuits and soft-ware (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chipset (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments as described may also be carried out in the form of a computer process defined by a computer program or portions thereof. Embodiments of the methods described in connection with FIGS. 2 to 7 may be carried out by executing at least one portion of a computer program comprising corresponding instructions. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways, e.g. applied in connection with other channel codes than the LDPC codes. Further, it is clear to a person skilled in the art that the described embodiments may, but are not required to, be combined with other embodiments in various ways.

The invention claimed is:

1. A method comprising:
encoding, by a first apparatus, a data bit set by using a first parity check matrix in a low-density parity check encoder, thus providing a first parity bit set, wherein the first parity check matrix comprises a plurality of sub-matrices having a single non-zero diagonal and a plurality of sub-matrices being zero matrices;
causing, by the first apparatus, transmission of the data bit set and at least some parity bits of the first parity bit set to a second apparatus in a message;
determining, by the first apparatus, that the second apparatus was not capable of decoding the data bit set;
modifying, by the first apparatus, the first parity check matrix by using an overlapping matrix such that overlapping elements of the first parity check matrix and the overlapping matrix are combined, thus acquiring a second parity check matrix;
encoding, by the first apparatus, the data bit set by using the second parity check matrix in the low-density parity check encoder, thus providing a second parity bit set; and
causing transmission of at least some parity bits of the second parity bit set to the second apparatus.

2. The method of claim 1, wherein the second parity check matrix comprises at least one sub-matrix having a plurality of non-zero diagonals.

3. The method of claim 1, further comprising after causing the transmission of the at least some parity bits of the second parity bit set to the second apparatus:
determining, by the first apparatus, that the second apparatus still was not capable of decoding the data bit set;
modifying, by the first apparatus, the first parity check matrix by using a second overlapping matrix, different from said overlapping matrix, such that overlapping elements of the first parity check matrix and the second overlapping matrix are combined, thus acquiring a third parity check matrix;
encoding, by the first apparatus, the data bit set by using the third parity check matrix in the low-density parity check encoder, thus providing a third parity bit set; and
causing transmission of at least some parity bits of the third parity bit set to the second apparatus.

4. An apparatus comprising:
at least one processor, and
at least one memory comprising a computer program code, wherein the processor, the memory, and the computer program code are configured to cause the apparatus to:
encode a data bit set by using a first parity check matrix in a low-density parity check encoder, thus providing a first parity bit set, wherein the first parity check matrix comprises a plurality of sub-matrices having a single non-zero diagonal and a plurality of sub-matrices being zero matrices;
cause transmission of the data bit set and at least some parity bits of the first parity bit set to a second apparatus in a message;
determine that the second apparatus was not capable of decoding the data bit set;
modify the first parity check matrix by using an overlapping matrix such that overlapping elements of the first parity check matrix and the overlapping matrix are combined, thus acquiring a second parity check matrix;
encode the data bit set by using the second parity check matrix in the low-density parity check encoder, thus providing a second parity bit set; and
cause transmission of at least some parity bits of the second parity bit set to the second apparatus.

5. The apparatus of claim 4, wherein the second parity check matrix comprises at least one sub-matrix having a plurality of non-zero diagonals.

6. The apparatus of claim 4, wherein the processor, the memory, and the computer program code are configured to cause the apparatus to combine the overlapping elements of the first parity check matrix and the overlapping matrix by using one of the following combining methods: a sum, a modulo-2 sum, a binary OR-operation, and a binary exclusive OR-operation.

7. The apparatus of claim 4, wherein the overlapping matrix is of the same size as the first parity check matrix.

8. The apparatus of claim 4, wherein the overlapping matrix is of a different size than the first parity check matrix.

9. The apparatus of claim 4, wherein the processor, the memory, and the computer program code are configured to cause the apparatus to perform at least the following after causing the transmission of the at least some parity bits of the second parity bit set to the second apparatus:
determine that the second apparatus still was not capable of decoding the data bit set;
modify the first parity check matrix by using a second overlapping matrix, different from said overlapping matrix, such that overlapping elements of the first parity check matrix and the second overlapping matrix are combined, thus acquiring a third parity check matrix;
encode the data bit set by using the third parity check matrix in the low-density parity check encoder, thus providing a third parity bit set; and
cause transmission of at least some parity bits of the third parity bit set to the second apparatus.

10. The apparatus of claim 4, wherein the processor, the memory, and the computer program code are configured to cause the apparatus to perform at least the following after causing the transmission of the at least some parity bits of the second parity bit set to the second apparatus:
determine that the second apparatus still was not capable of decoding the data bit set;
modify the second parity check matrix by using a second overlapping matrix, different from said overlapping matrix, such that overlapping elements of the second parity check matrix and the second overlapping matrix are combined, thus acquiring a third parity check matrix;
encode the data bit set by using the third parity check matrix in the low-density parity check encoder, thus providing a third parity bit set; and
cause transmission of at least some parity bits of the third parity bit set to the second apparatus.

11. An apparatus comprising:
at least one processor, and
at least one memory comprising a computer program code, wherein the processor, the memory, and the computer program code are configured to cause the apparatus to:

receive, from a second apparatus, a first message comprising a data bit set and a first parity bit set;
decode, in a low-density parity check decoder, the data bit set by using the first parity bit set and a first parity check matrix known to be used for encoding the data bit set in the second apparatus, wherein the first parity check matrix comprises a plurality of sub-matrices having a single non-zero diagonal and a plurality of sub-matrices being zero matrices;
determine that the low-density parity check decoder was not capable of decoding the data bit set;
receive, from the second apparatus, a second message comprising a second parity bit set different from the first parity bit set;
modify the first parity check matrix by using an overlapping matrix such that overlapping elements of the first parity check matrix and the overlapping matrix are combined, thus acquiring a second parity check matrix;
decode, in the low-density parity check decoder, the data bit set by using at least the second parity bit set and the second parity check matrix.

12. An apparatus comprising:
at least one processor, and
at least one memory comprising a computer program code, wherein the processor, the memory, and the computer program code are configured to cause the apparatus to:
receive, from a second apparatus, a first message comprising a data bit set and a first parity bit set;
decode, in a low-density parity check decoder, the data bit set by using the first parity bit set and a first parity check matrix known to be used for encoding the data bit set in the second apparatus;
determine that the low-density parity check decoder was not capable of decoding the data bit set;
receive, from the second apparatus, a second message comprising a second parity bit set different from the first parity bit set;
modify the first parity check matrix by using an overlapping matrix such that overlapping elements of the first parity check matrix and the overlapping matrix are combined, thus acquiring a second parity check matrix;
decode, in the low-density parity check decoder, the data bit set by using at least the second parity bit set and the second parity check matrix, wherein the second parity check matrix comprises at least one sub-matrix having a plurality of non-zero diagonals.

13. The apparatus of claim 11, wherein the processor, the memory, and the computer program code are configured to cause the apparatus to combine the overlapping elements of the first parity check matrix and the overlapping matrix by using one of the following combining methods: a sum, a modulo-2 sum, a binary OR-operation, and a binary exclusive OR-operation.

14. The apparatus of claim 11, wherein the overlapping matrix is of the same size as the first parity check matrix.

15. The apparatus of claim 11, wherein the overlapping matrix is smaller or larger than the first parity check matrix.

16. The apparatus of claim 11, wherein the processor, the memory, and the computer program code are configured to cause the apparatus to perform at least the following after decoding the data bit set by using at least the second parity bit set and the second parity check matrix:
determine that the low-density parity check decoder still was not capable of decoding the data bit set;
receive, from the second apparatus, a third message comprising a third parity bit set different from the first parity bit set and the second parity bit set;
modify the first parity check matrix by using a second overlapping matrix such that overlapping elements of the first parity check matrix and the second overlapping matrix are combined, thus acquiring a third parity check matrix;
decode, in the low-density parity check decoder, the data bit set by using at least the third parity bit set and the third parity check matrix.

17. The apparatus of claim 11, wherein the processor, the memory, and the computer program code are configured to cause the apparatus to perform at least the following after decoding the data bit set by using at least the second parity bit set and the second parity check matrix:
determine that the low-density parity check decoder still was not capable of decoding the data bit set;
receive, from the second apparatus, a third message comprising a third parity bit set different from the first parity bit set and the second parity bit set;
modify the second parity check matrix by using a second overlapping matrix such that overlapping elements of the second parity check matrix and the second overlapping matrix are combined, thus acquiring a third parity check matrix;
decode, in the low-density parity check decoder, the data bit set by using at least the third parity bit set and the third parity check matrix.

18. The method of claim 1, further comprising combining the overlapping elements of the first parity check matrix and the overlapping matrix by using one of the following combining methods: a sum, a modulo-2 sum, a binary OR-operation, and a binary exclusive OR-operation.

19. The method of claim 1, wherein the overlapping matrix is one of the same size as the first parity check matrix or a different size then the first parity check matrix.

20. The method of claim 1, further comprising, after causing the transmission of the at least some parity bits of the second parity bit set to the second apparatus:
determining that the second apparatus still was not capable of decoding the data bit set;
modifying the first parity check matrix by using a second overlapping matrix, different from said overlapping matrix, such that overlapping elements of the first parity check matrix and the second overlapping matrix are combined, thus acquiring a third parity check matrix;
encoding the data bit set by using the third parity check matrix in the low-density parity check encoder, thus providing a third parity bit set; and
causing transmission of at least some parity bits of the third parity bit set to the second apparatus.

* * * * *